United States Patent [19]

Moellmer

[11] 4,263,569

[45] Apr. 21, 1981

[54] SURFACE ACOUSTIC WAVE ARRANGEMENT WITH IMPROVED SUPPRESSION OF SPURIOUS SIGNALS

[75] Inventor: Frank Moellmer, Haar, Fed. Rep. of Germany

[73] Assignee: Siemens Aktiengesellschaft, Berlin & Munich, Fed. Rep. of Germany

[21] Appl. No.: 66,665

[22] Filed: Aug. 15, 1979

[30] Foreign Application Priority Data

Sep. 13, 1978 [DE] Fed. Rep. of Germany ....... 2839851

[51] Int. Cl.³ ...................... H03H 9/145; H03H 9/25; H03H 9/64; H03H 9/42
[52] U.S. Cl. ................................... 333/151; 333/153; 333/154; 333/194; 333/196
[58] Field of Search ............................... 333/193–196, 333/150–155; 310/313; 331/107 A; 330/5.5

[56] References Cited

U.S. PATENT DOCUMENTS

| | | | |
|---|---|---|---|
| 3,680,007 | 7/1972 | Tseng | 333/154 |
| 3,872,410 | 3/1975 | Zucker | 333/194 |
| 4,162,415 | 7/1979 | Andreev et al. | 333/193 X |

*Primary Examiner*—Marvin L. Nussbaum
*Attorney, Agent, or Firm*—Hill, Van Santen, Steadman, Chiara & Simpson

[57] ABSTRACT

A surface acoustic wave filter is disclosed having an interdigitated structure of transducer fingers on a piezo substrate. Spurious signals are suppressed by employment of a slanted placement of transducer fingers at an output region of a weighted input transducer or at an input region of a weighted output transducer.

8 Claims, 2 Drawing Figures

SURFACE ACOUSTIC WAVE ARRANGEMENT WITH IMPROVED SUPPRESSION OF SPURIOUS SIGNALS

BACKGROUND OF THE INVENTION

The invention refers to a surface acoustic wave arrangement wherein a piezo substrate is provided with a plurality of interdigitated metallic fingers on a surface thereof forming input, output, and coupling transducers.

From the state of the art, in particular television device circuits, surface acoustic wave filters are known wherein at least one transducer, for example an input transducer has an interdigitated structure formed of meshing comb-like conductive transducer fingers on a substrate with piezoelectric effect. The transducer conductive fingers have different lengths and adjacent transducer fingers have overlapping which varies. With these differing finger lengths and differing overlapping, the transmission function of the transducer can be pre-set in a way that is necessary for the particular use desired. This technique of providing overlapping is designated as a weighting of the transducer fingers.

The different lengths of the transducer fingers result in an active portion of the transducer which does not necessarily have a width which remains the same over the entire length of the transducer. The length is defined as being parallel and the width is defined as being transverse to the propagation of mechanical piezoelectric induced surface acoustic waves. Surface acoustic waves which are produced in the initial part of the transducer and from there proceed outward, would then, during their passage through the transducer, pass through surface areas of a substrate body as viewed over a width of the transducer where either none or an unequal number of transducer fingers are present. For a uniform, spurious-free path for the surface acoustic waves, in particular so as to avoid transit time differences in neighboring areas transverse to the wave propagation direction, one also uses transducer fingers which have significant portions of their length inactive in the transducer because of the lack of overlapping opposed polarity length portions of adjacent fingers in this area. Next to a given finger there is present no transducer finger of opposed polarity. Such portions are designated as dummy fingers.

In the case of the surface acoustic wave arrangements as described with an input transducer and an output transducer for transmission of a signal from the input to the output, signals appear which are spurious and which have transit time shifts opposed to the signal transmission. For example, such a spurious signal can exist with a portion of the surface acoustic waves which have already arrived in the output transducer in the area of the transducer fingers of the output transducer. There they experience a mechanical and/or electrical reflection. The wave passes back through the surface acoustic wave arrangement to the input transducer as a reflected signal in a direction opposed to the intended direction, and there again, in part is reflected back mechanically and/or electrically. Such a signal which passes through the surface acoustic wave arrangement three times is designated as a triple transit signal.

SUMMARY OF THE INVENTION

It is an object of the present invention to design a surface acoustic wave arrangement in such manner that at least a significant decrease of such spurious signals are present at the output transducer because of inner reflections in the arrangement with a passage time which deviates from the passage time of the desired signal.

This problem is solved in the case of such a surface acoustic wave arrangement according to the present invention wherein inactive length portions of the transducer fingers are aligned in slanted fashion relative to a propagation direction of surface acoustic waves such that undesirable reflected waves are reflected towards sides of the transducer so as not to be re-reflected.

The present invention is based upon eliminating the spurious signals as described above so that unavoidable reflections which lead to such an spurious signal are influenced such that they no longer have any damaging influence upon the desired signal of the arrangement.

DESCRIPTION OF THE PREFERRED EMBODIMENTS

Figure 1:
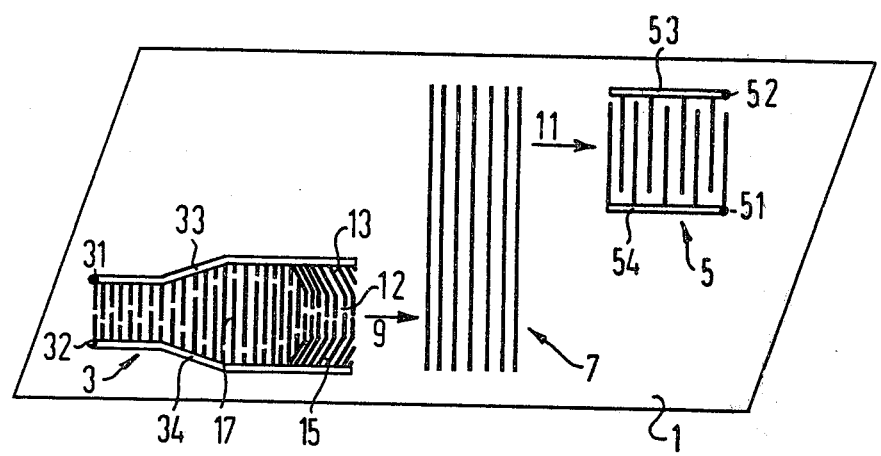
FIG. 1 shows a plan view of a surface acoustic wave arrangement according to the invention.

FIG. 1 shows a substrate body 1 with an input transducer 3 and output transducer 5 applied to its surface, as well as a multi-strip coupler 7 which is also arranged on the surface. With the arrows 9 and 11, the propagation direction of a wave front of the surface acoustic waves between input transducer 3 and output transducer 5 is indicated. Because of the presence of the multi-strip coupler 7, a parallel wave front spreading path of the surface acoustic waves is present by which an undesired signal transmission of entire waves from the input transducer 3 to the output transducer 5 is suppressed in a way known previously. Numerals 31 and 32 as well as 51 and 52 designate the electrical input or, respectively, output connections of the surface acoustic wave arrangement. The individual transducer fingers are connected via the contact strips 33 and 34, or respectively, 53 and 54. By applying an electrical high frequency signal, for example, a television IF signal, onto the connections 31 and 32, a surface acoustic wave is generated in the surface of the piezoelectrical material of the substrate body 1 in the area of the input transducer 3. From this mechanical surface wave, because of the piezo effect of the substrate body 1, an electrical output signal which is influenced in the prescribed manner and corresponds to the prescribed transmission function, is recovered at the connections 51 and 52 in the output transducer 5.

In the case of a known arrangement upon which FIG. 1 is based, the transducer fingers which are present in the areas designated 13 and 15, are aligned in the same cross-wise way i.e. perpendicularly to the spreading direction 9, 11, as is the case in the output transducer 5 in the multi-strip coupler 7 and in the region 17 of the input transducer 3.

Figure 2:
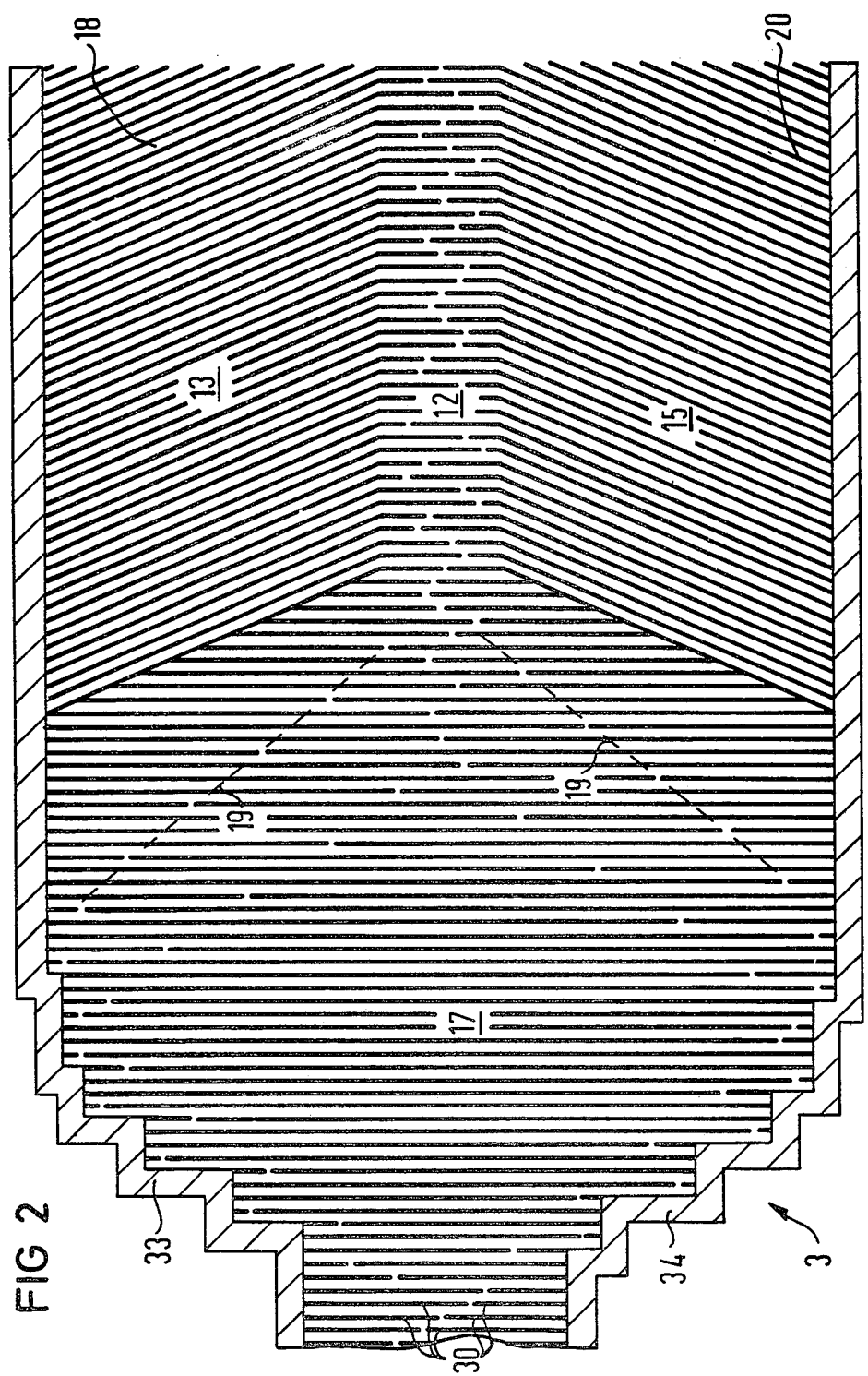
FIG. 2 shows an enlarged fragmentary view (dimension 100:1) of an input transducer of the surface acoustic wave arrangement according to FIG. 1 and designed according to the invention.

As can be seen in FIG. 1 but which is nevertheless more clearly represented in FIG. 2, the overlapping area of individual neighboring fingers, here in the case of the input transducer, is variably large as viewed over the length of the input transducer, that is, in the direction of the wave propagation. In the entry area (near connections 31 and 32) as well as in the end area (near the multi-strip coupler 7), the mutual adjacent overlap of the transducer fingers is only relatively slight. In the middle region 17 of the transducer there is a large amount of overlapping where the maximum width of the input transducer 3 viewed perpendicular to the spreading direction 9 is provided.

In the end region of the input transducer 3 adjacent the multi-strip coupler 7, because of the smaller overlapping width there, the outer contact connections 33 and 34 of the transducer fingers of the input transducer could again be more closely aligned as is the case for the starting area. Given the concern for spurious-free wave propagation of the surface waves, nevertheless, customarily the transducer fingers in this end area are made just as long as the fingers of the middle area 17, and outside of the overlapping regions of adjacent transducer fingers, relatively large length portions of the individual transducer fingers are provided as dummy fingers which are inactive for realizing the transmission function. Electrically, they only serve as feed lines between the outer contact connections 33 and 34 and the active parts of the transducer fingers which overlap one another.

FIG. 2 shows an enlarged view of input transducer 3 designed according to the invention. Its strip shaped transducer fingers 30 extend from the border strips of the contact connections 33 and 34 positioned opposite one another and have variable overlapping lengths. In the surface portion designated 12, between the surface portions 13 and 15, and also in the region bordering on the surface portion 12 to the left in FIG. 2, the overlapping of the ends of the adjacent transducer fingers which are connected on the opposing side in each case, is only relatively slight (in comparison to the overlapping in region 17). Therefore the surface portions 13 and 15 which are inactive for the actual transducer characteristic, would actually not need to containy any transducer fingers at all. For the reasons already mentioned relative to the mechanical spreading of the surface acoustic waves, nevertheless, in these surface portions 13 and 15, inactive length portions (dummy fingers) of the transformer fingers are present, which in the case of the state of the art are aligned perpendicular to the spreading direction of the surface wave (different than FIGS. 1 and 2), and thereby parallel to all the remaining transducer fingers.

In the case of the invention, however, at least in the case of a significant number of such transducer fingers with relatively large inactive length portions, that is, transducer fingers of surface portions 13 and 15 with overlapping in narrow surface portion 12, a large portion of these inactive length portions are arranged parallel to one another and slanted relative to the wave propagation direction 9. As can also be seen in the Figures, short inactive finger portions still lie in the surface portion 12. However, the total output front of the transducer according to the invention is equipped to a large extent with finger portions which slant. In particular, the slanting inactive portion of the transducer fingers of the surface portion 15 are inclined opposite to those of the surface portion 13. This design is designated a herringbone.

The slanted inactive length portions or dummy fingers must not extend to all the transducer fingers in the transducer having relatively long inactive length portions. As shown in FIG. 2, to the left of the surface portions 13 and 15 there are still some transducer fingers present which do not slant according to the invention and which have only a relatively small overlap. It is important that in a direction toward the wave output of the input transducer designed according to the invention or, in the case of the design of the output transducer according to the invention in a direction of its wave input-some inactive length portions (dummy fingers) are essential which slant according to the invention.

With the invention it is avoided that an energy portion of the surface waves which unavoidably is reflected mechanically and/or electrically at or in the output transducer 5 and which runs opposite to the wave propagation direction 9 and 11, is reflected back to an interfering extent at the input transducer 3. Also, at the inactive slanting length portions or dummy fingers of the input transducer, a surface acoustic wave which breaks in an opposing direction to the wave propagation direction 9 in the input transducer 3, corresponding to the reflection laws, is reflected away toward the side, so that no back reflection of an interfering signal arrives at the output transducer 5. A surface acoustic wave portion which is reflected at the active portion of the transducer fingers in the surface area 12 is comparatively negligible in magnitude.

Numerals 18 and 20 designate sub-regions of the surface portions 13 and 15 in which the inactive fingers are cut off such that there results an overall straight wave front of the output of this input transducer so that for the output transducer, a straight wave front at its input results. These dummy fingers, which are not even necessary as feed lines to an active finger portion, serve the purpose of having the wave run out of the transducer with a straight wave front. Over the entire wave front uniform covering of the substrate surface with electrode fingers is provided so that no lack of symmetry is present for the mechanical surface acoustic waves.

An advantageous inclination of the dummy finger lies between 55° to 75° relative to the spreading direction, that is, 15° to 35° to the remaining transducer fingers which are perpendicular to the spreading direction. An optimum for the orientation was found at an inclination angle of 67.5°. An inclination to be preferably used for the dummy fingers is one which is provided according to an envelope curve of the overlapping region in the middle region 17 of the transducer. This envelope curve is illustrated by means of the broken double lines designated 19. The technique according to the invention can be realized at the input transducer and/or at the output transducer, to the extent that they are designed with such weighted fingers. In conclusion, weighting denotes that the individual transducer fingers or at least a number of the transducer fingers of the respective transducers have a longitudinal portion which is inactive. An active longitudinal portion is present at a location where, between two adjacent transducer fingers which are connected to one and the same given electrode such as 33, no longitudinal portion of such a finger is present which is connected to an opposite electrode such as 34 across from the given electrode. For a transducer according to FIG. 2, such inactive longitudinal portions for the transducer fingers are present in the areas 13 and 15, as well as between the upper line 19 and the area 13, and between the lower line 19 and the area 15. In accordance with the invention, for at least some of such fingers with an inactive longitudinal portion, these inactive longitudinal portions are oriented obliquely relative to the propagation direction.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A surface acoustic wave arrangement, comprising: a piezo substrate; an input transducer and an output transducer on the piezo substrate, at least one of the transducers having weighted transducer fingers which overlap up to a given maximum width, some of the individual transducer fingers each having an inactive length portion which functions as a dummy finger; and some of the inactive length portions at least partially within said maximum width in a propagation direction of surface waves being aligned in slanted fashion relative to said propagation direction of surface waves.

2. A surface acoustic wave arrangement according to claim 1 wherein a slant angle of the inactive length portions corresponds to an envelope formed by ends of active length portions in an adjacent active portion of the transducer.

3. A surface acoustic wave arrangement according to claim 1 wherein the slant angle of the inactive length portions is 55® to 75° relative to the wave propagation direction.

4. A surface acoustic wave arrangement according to claim 3 wherein the slant angle is 67.5° plus or minus 5%.

5. A surface acoustic wave arrangement according to claim 1 wherein slanted aligned inactive length portions of the transducer fingers are provided at an end of the transducer having end points which lie along a line perpendicular to the wave propagation direction.

6. A surface acoustic wave arrangement according to claim 1 wherein inactive length portions extending from one side of the transducer are aligned in a different direction than the inactive length portions from the opposite side.

7. A surface acoustic wave arrangement, comprising: a piezo substrate; a transducer on the piezo substrate, said transducer being formed by a plurality of interdigitated fingers which overlap up to a given maximum width, said transducer having first and second lateral conductive strips with each of the strips having the transducer fingers extending towards the other lateral strip, the second lateral strip having corresponding fingers extending in line with the fingers of the first lateral strip and establishing a gap between corresponding fingers; some of the individual transducer fingers having inactive length portions functioning as dummy fingers; and at least some of the inactive length portions at least partially within said maximum width in a propagation direction of surface waves being aligned in slanted fashion relative to said propagation direction of surface acoustic waves.

8. The arrangement of claim 7 wherein the transducer is an input transducer and the inactive length portions which are slanted are at an output end of the input transducer, and wherein dummy fingers extending from the first lateral strip and also from the second lateral strip slant towards the output and at an angle which is symmetrical to a central axis along the direction of wave propagation, and wherein the angle of slant is chosen such that waves travelling from a front end of the input transducer towards a rear end of the input transducer and which are partially reflected at the rear end of the transducer are reflected towards lateral sides of the transducer.

* * * * *